(12) United States Patent
Yoo et al.

(10) Patent No.: US 9,000,665 B2
(45) Date of Patent: Apr. 7, 2015

(54) ORGANIC LIGHT EMITTING DIODE DISPLAY DEVICE AND METHOD OF MANUFACTURING THE SAME

(71) Applicant: LG Display Co., Ltd., Seoul (KR)

(72) Inventors: Choong-Keun Yoo, Gyeonggi-do (KR); Soo-Young Yoon, Gyeonggi-do (KR); Hee-Seok Yang, Gyeonggi-do (KR); Jong-Kyun Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 210 days.

(21) Appl. No.: 13/717,873

(22) Filed: Dec. 18, 2012

(65) Prior Publication Data

US 2013/0249383 A1 Sep. 26, 2013

(30) Foreign Application Priority Data

Mar. 20, 2012 (KR) .................. 10-2012-0028179
Sep. 11, 2012 (KR) .................. 10-2012-0100222

(51) Int. Cl.
*H01J 1/62* (2006.01)
*H05B 33/22* (2006.01)
*H05B 33/10* (2006.01)
*H01L 51/52* (2006.01)

(52) U.S. Cl.
CPC ............... *H05B 33/22* (2013.01); *H05B 33/10* (2013.01); *H01L 51/5281* (2013.01)

(58) Field of Classification Search
USPC .................................. 313/504, 498, 506, 512
See application file for complete search history.

(56) References Cited

FOREIGN PATENT DOCUMENTS

| JP | 2006-012726 A | 1/2006 |
| KR | 10-2003-0095430 A | 12/2003 |
| KR | 10-2010-0137272 A | 12/2010 |

*Primary Examiner* — Vip Patel
(74) *Attorney, Agent, or Firm* — Morgan, Lewis & Bockius LLP

(57) ABSTRACT

An organic light emitting diode display device includes a substrate; an antireflection layer on a first surface of the substrate and including a metallic layer and an insulating layer; a driving element portion on the antireflection layer and including thin film transistors and metallic lines; and an organic light emitting portion driven by the driving element portion.

17 Claims, 8 Drawing Sheets

ORGANIC LIGHT EMITTING DIODE DISPLAY DEVICE AND METHOD OF MANUFACTURING THE SAME

This application claims the priority benefit of Korean Patent Application Nos. 10-2012-0028179, filed in Korea on Mar. 20, 2012 and 10-2012-0100222 filed in Korea on Sep. 11, 2012, which are hereby incorporated by reference in its entirety.

BACKGROUND

1. Field of the Disclosure

The present disclosure relates to an organic light emitting diode display device and a method of manufacturing the same, and more particularly, to an organic light emitting diode display device and a method of manufacturing the same that improve lifetime and reduce manufacturing costs.

2. Discussion of the Related Art

Recently, with rapid development of information technologies, flat panel display (FPD) devices having a thin profile and light weight have been pursued. The flat panel display devices, representatively, include liquid crystal display devices and organic light emitting diode display devices. The organic light emitting diode display devices may be referred to as organic electroluminescent display devices. Since the organic light emitting diode display devices do not need an additional light source, such as backlights of the liquid crystal display devices, and have high color reproduction ranges, the organic light emitting diode display devices are thinner and display sharper images than the liquid crystal display devices.

An exemplary organic light emitting diode display devices include pixels, each of which comprises red, green and blue sub pixels and which are arranged in a screen. The sub pixels are defined by crossing of gate lines and data lines. Each sub pixel is independently driven by driving elements including thin film transistors, and the thin film transistors and metallic lines are disposed in a driving element region. At this time, if the thin film transistors and the metallic lines in the driving element region reflect outside light, outer visibility is lowered.

FIG. 1 is a cross-sectional view of illustrating a part of an active matrix type organic light emitting diode display device according to the related art.

In FIG. 1, the organic light emitting diode display device of the related art includes an organic light emitting diode 120 and a polarizer 110 formed on a substrate 101 through which light emitted from the organic light emitting diode 120 is transmitted to the outside. The polarizer 110 minimizes reflection of light from the outside and improves outer visibility. The polarizer 110 includes a linear polarizer 111 and a λ/4 phase retarder 113. The linear polarizer 111 polarizes incident light horizontally or vertically. A first adhesive layer 112 is formed between the linear polarizer 111 and the λ/4 phase retarder 113. And second adhesive layer 114 sticks both the polarizer 111 and the substrate 101. The organic light emitting diode 120 includes an anode electrode 121, an organic light-emitting layer 122 and a cathode electrode 123.

Light from the outside is horizontally and linearly polarized though the linear polarizer 111 and is circularly polarized through the λ/4 phase retarder 113. The circularly polarized light is mostly reflected at the cathode electrode 123 of the organic light emitting diode 120, is vertically and linearly polarized through the λ/4 phase retarder 113, and is dissipated passing through the linear polarizer 111.

When the reflection of outside light is minimized using the polarizer 110, however, less than 45% of light emitted from the organic light emitting diode 120 is transmitted, and more than half of the brightness is deceased. Therefore, if more power is used to compensate the deceased brightness, the lifetime of a light emitting portion is reduced. Also, the polarizer 110 is expensive. Therefore, if the polarizer 110 is used for antireflection, cost competitiveness of organic light emitting diode display devices may be lowered.

SUMMARY

The present disclosure is directed to an organic light emitting diode display device that substantially obviates one or more of the problems due to limitations and disadvantages of the related art.

One of advantages of the present disclosure is to provide an organic light emitting diode display device that improves the brightness to increase the lifetime and reduces manufacturing costs by replacing the polarizer with an antireflection layer.

In one aspect, an organic light emitting diode display device may include a substrate; an antireflection layer on a first surface of the substrate, the antireflection layer comprising a metallic layer and an insulating layer; a driving element portion on the antireflection layer, the driving element portion comprising a thin film transistor and metallic lines, wherein the thin film transistor comprises a gate electrode, a gate insulation layer, an active layer, and source and drain electrodes; a reflecting metal portion on the antireflection layer under the metallic lines, the reflecting metal portion formed of the same material as the gate electrode; and an organic light emitting portion driven by the driving element portion, the organic light emitting portion comprising a color filter, an anode electrode, and an organic light emitting layer.

In another aspect, a method of fabricating an organic light emitting diode display device may include forming an antireflection layer on a first surface of a substrate, wherein the antireflection layer comprises a metallic layer and an insulating layer; forming a metal layer on the antireflection layer; patterning the metal layer to form a gate electrode and a reflecting metal portion; forming a gate insulation layer, an active layer, and source and drain electrodes to provide a driving element portion; and forming an organic light emitting portion driving by the driving element portion.

It is to be understood that both the foregoing general description and the following detailed description are exemplary and explanatory and are intended to provide exemplary embodiments of the invention as claimed.

BRIEF DESCRIPTION OF THE DRAWINGS

The accompanying drawings are included to provide a further understanding of the invention and are incorporated in and constitute a part of this specification. The drawings illustrate exemplary embodiments of the invention and together with the description serve to explain the principles of the invention.

DETAILED DESCRIPTION OF THE ILLUSTRATED EMBODIMENTS

Reference will be made in detail to exemplary embodiments of the present invention, examples of which are illustrated in the accompanying drawings.

Figure 1:
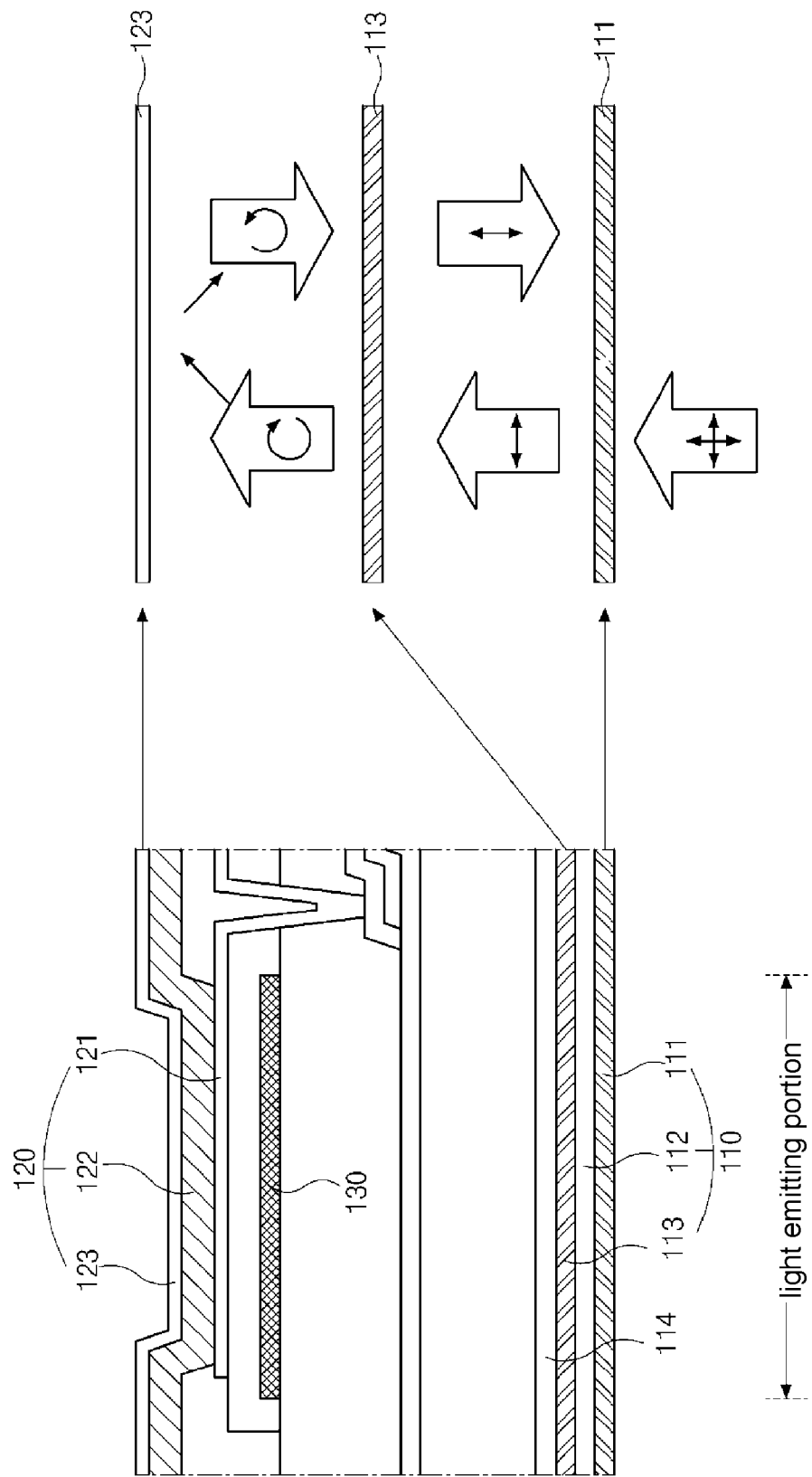
FIG. 1 is a cross-sectional view of illustrating a part of an organic light emitting diode display device according to the related art.
Figure 2:
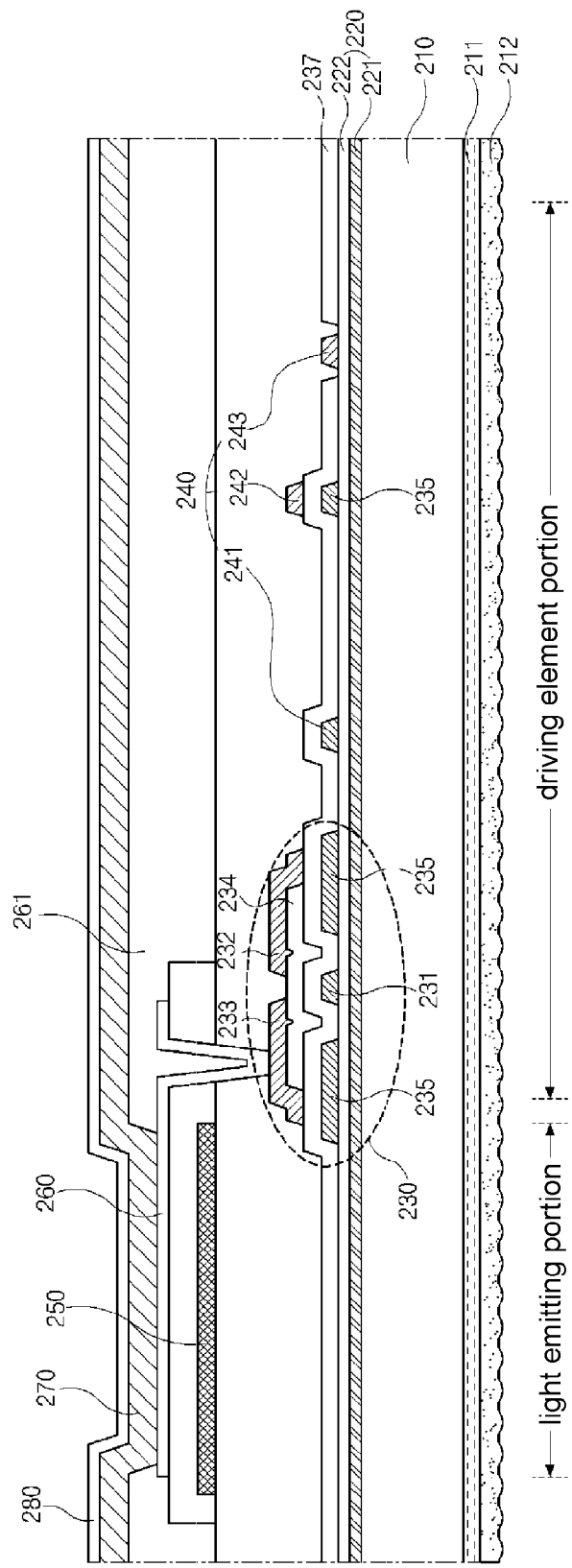
FIG. 2 is a cross-sectional view of illustrating an organic light emitting diode display device according to some embodiments of the present invention.

Referring to FIG. 2, the organic light emitting diode display device according to some embodiments of the present invention includes a substrate 210, a light emitting portion, a driving element portion an antireflection layer 220, an antireflection film 211 and micro lens film (MLF) 212.

The substrate 210 may be made of glass or transparent flexible materials such as polyimide, polyetherimide, polyethyeleneterepthalate and etc.

The light emitting portion includes the portion where an organic light-emitting layer 270 contacts an anode electrode 260 and a cathode electrode 280, and white light is emitted. The light emitting portion includes a color filter 250, the anode electrode 260, the organic light emitting layer 270 and the cathode electrode 280. The emitted light may be colored into one of red, green, blue, yellow, magenta and cyan while passing through a color filter 250 formed under the organic light-emitting layer 270 and is transmitted through the substrate 210. In some embodiments, a bank layer 251 is formed on the anode electrode 250 under organic light emitting portion.

The driving element portion may include a thin film transistor 230 and metallic lines 240. For convenience, only the thin film transistor 230 is shown in FIG. 2, but generally, two or more thin film transistors including a switching transistor and a driving transistor are formed in each sub pixel of the organic light emitting diode display device. The thin film transistors may include a gate electrode 231, a gate insulation layer 237, an active layer 234, and source and drain electrodes 232 and 233. The metallic lines 240 may include a compensation circuit (not shown), a gate line 241, a data line 242 and a power supply line 243 in the driving elements. Since the compensation circuit is very complicated and can be variously designed, the compensation circuit is not shown in the figure.

The antireflection layer 220 may be formed on the substrate 210 and minimizes reflection of light from the outside. The antireflection layer 220 may be formed all over the substrate 210. If the antireflection layer 220 is formed all over the substrate 210, the antireflection layer 220 may absorb light emitted from the organic light-emitting layer 270, and the brightness may be lowered. However, if the antireflection layer 220 is formed all over the substrate 210, a photolithographic process may be skipped, and manufacturing processes may be simplified. The structure of the antireflection layer 220 and the principle of antireflection are shown in more detail in FIG. 5.

The antireflection film 211 is formed on a second surface of the substrate 210. The antireflection film 280 may prevent the substrate 210 from reflecting outside light because the outside light incident on a panel may also be reflected by the substrate 210.

The micro lens film 212 may be formed on the second surface of the substrate 210. In other embodiments, micro lens film 212 may be formed on the antireflection film 211. The micro lens film 212 may prevent the light emitted from the organic light-emitting layer 260 from being trapped in the panel due to total reflection and allows the light to be dissipated. Therefore, more light is transmitted, and the brightness is improved.

The micro lens film 290 may be formed as a film type and may be attached to the substrate 210 or to the antireflection layer 211. In other embodiments, the micro lens film 290 may be deposited by a sputtering method or a chemical vapor deposition method and may be formed on the entire or substantially entire surface of the substrate 210. Here, the antireflection layer 220 may not be limited to the shape and position shown in FIG. 2 and may have various shapes and positions described herein.

Figure 3:
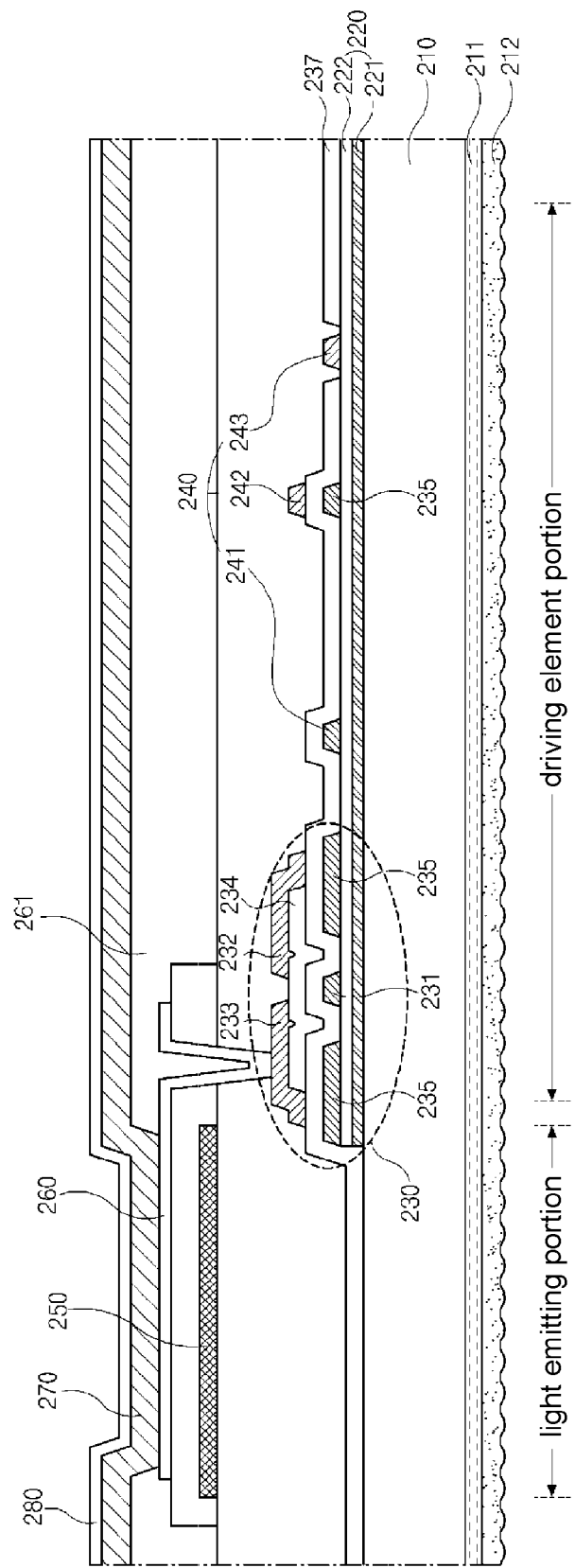
FIG. 3 is a cross-sectional view of illustrating an organic light emitting diode display device according to additional embodiments of the present invention.

FIG. 3 is a cross-sectional view of illustrating an organic light emitting diode display device including an antireflection layer according to additional embodiments of the present invention.

Referring to FIG. 3, the antireflection layer 220 may be formed on the first surface of the substrate 210 corresponding to the driving element portion. in some embodiments, the antireflection layer 220 is not formed in an area corresponding to the organic light emitting portion, and light emitted from the organic light emitting portion is prevented from being absorbed by the metallic layer 221 of the antireflection layer 220, thereby increasing transmittance and improving the brightness. In addition, the light from the organic light emitting portion may be prevented from being reflected twice by the insulating layer 222 and the metallic layer 221 and thus from being dissipated due to destructive interference. Accordingly, the brightness may be further improved.

To form the antireflection layer 220 in the area for the driving element portion excluding the organic light emitting portion, the antireflection layer 220 may be formed by using a mask also used to form color filter layer 250 and/or bank layer 261. Therefore, the antireflection layer 220 can be formed without an additional mask.

Figure 4:
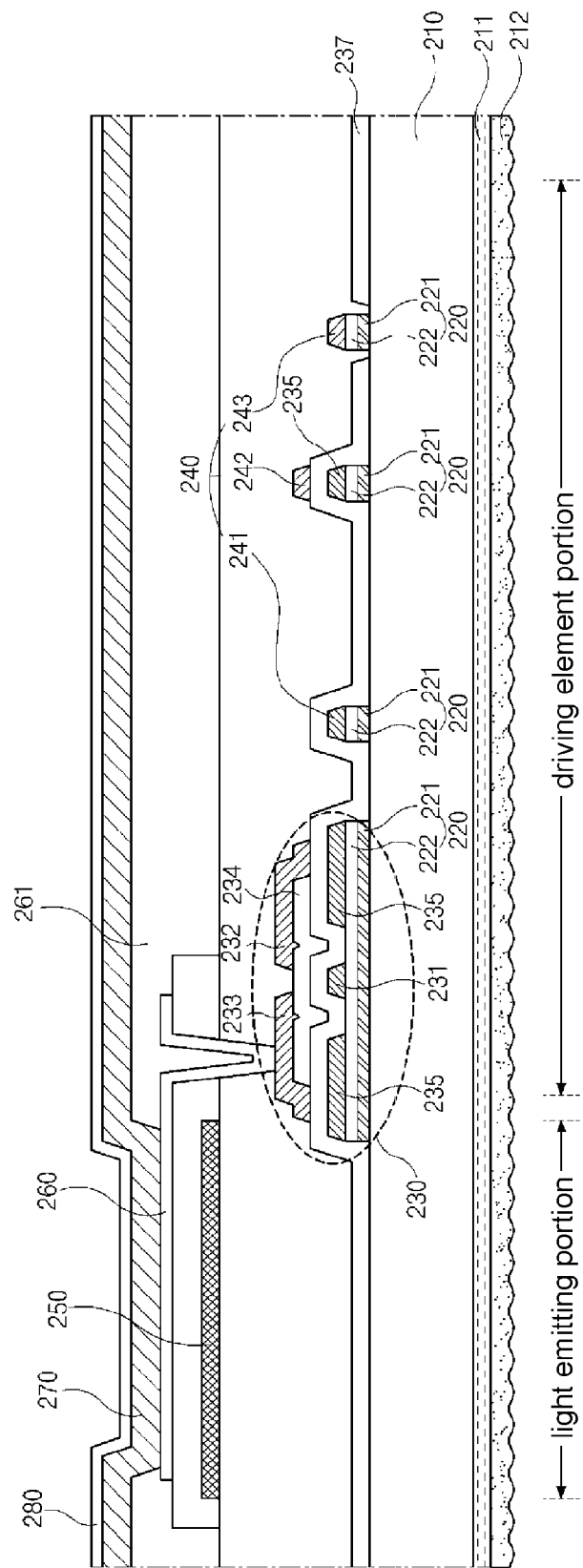
FIG. 4 is a cross-sectional view of illustrating organic light emitting diode display device according to additional embodiments of the present invention.

FIG. 4 is a cross-sectional view of illustrating an organic light emitting diode display device including an antireflection layer according to additional embodiments of the present invention.

Referring to FIG. 4, the antireflection layer 220 may be formed on the first surface of the substrate 210 corresponding to the thin film transistor 230 and the metallic lines 240 of the driving element portion. The metallic lines 240 may include the compensation circuit (not shown), the gate line 241, the data line 242 and the power supply line 243 in the driving elements.

Here, the antireflection layer may be formed through several light-exposing processes using two existing masks without an additional mask or may be formed through a single light-exposing process using a new mask. Using a new mask may simplify manufacturing processes, and using the existing masks may decrease the manufacturing costs. In case of using the existing masks, a material for the antireflection layer 220 is applied to the first surface of the substrate 210, and sequential light-exposing steps may be performed using a mask also used to form a gate electrode 231 and/or a mask also used to form source and drain electrodes 232 and 233. Then, a developing step is carried out, and the material for the antireflection layer 220 is etched, thereby forming the antireflection layer 220 in the areas of FIG. 4. At this time, for example, photoresist may be used. Since the gate line 241 may be formed through the same process as the gate electrode 231 and the data line 242, and the power supply line 243 may be formed through the same process as the source and drain electrodes 232 and 233, the antireflection layer 220 may be formed in the areas corresponding to the thin film transistor 230 and the metallic lines 240 using the two masks.

Figure 5:
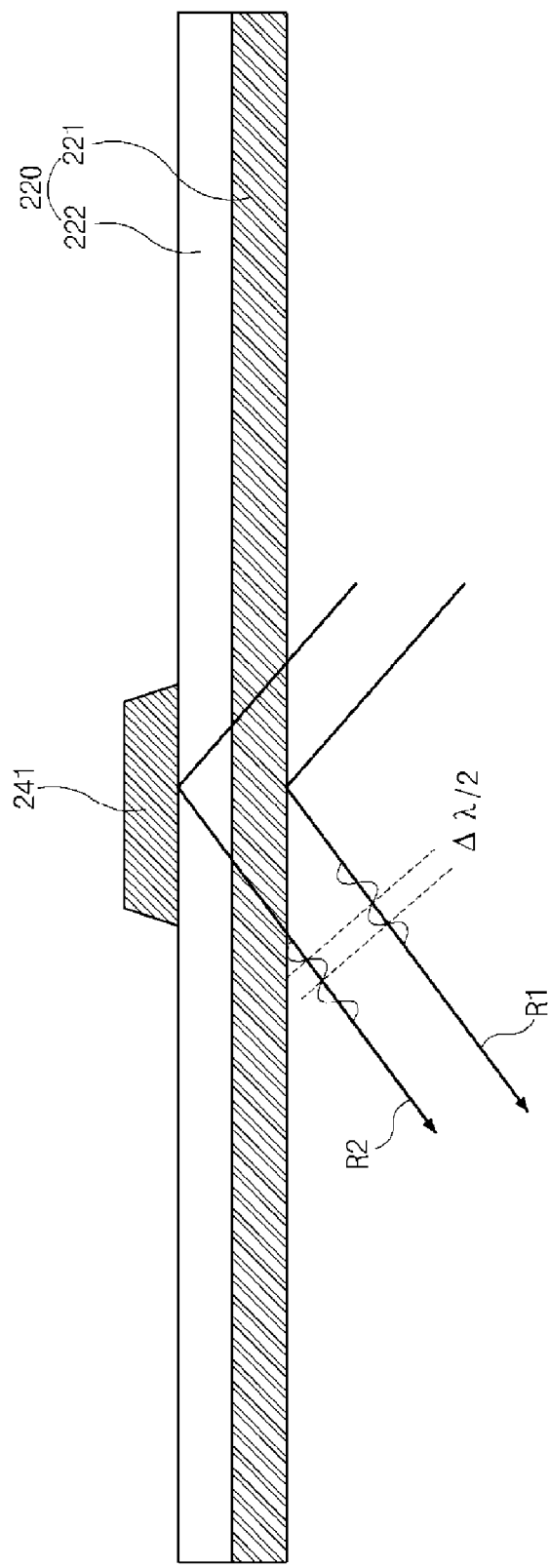
FIG. 5 is a cross-sectional view of illustrating an antireflection layer according to some embodiments of the present invention.

FIG. 5 is a cross-sectional view of illustrating the antireflection layer according to some embodiments of the present invention.

In FIG. 5, the antireflection layer 220 of the present invention may include at least one metallic layer 221 and at least one insulating layer 222. The metallic layer 221 and the insulating layer 222 may be sequentially layered on a first surface of the substrate 210, thereby forming the antireflection layer 220. Another insulating layer (not shown) may be formed under the metallic layer 221 for improving adhesion of the substrate 210 and the metallic layer 211. Here, the first surface may be one of upper and lower surfaces of the substrate 210. The antireflection layer 220 may have a multiple-structure including repetition of the above structure.

Preventing reflection of outside light by the antireflection layer 220 of the present invention may be divided into two processes. One is an outside light-absorbing process of the metallic layer 221, and the other is an outside light-dissipating process due to destructive interference of a first reflection light R1 from the metallic layer 221 and a second reflection light R2 from the gate line 241, one of the metallic lines. In FIG. 5. only the gate line 241 is shown, but metallic lines or parts of the thin film transistor 230 which are formed on the same layer with the gate line 241, may prevent reflection of outside light like the gate line 241 do. For example, the gate electrode 231 may be formed on the same layer with the gate line 241.

More particularly, some of the outside light incident on the metallic layer 221 through the substrate 210 is reflected into the first reflection light R1, some other outside light is absorbed by the metallic layer 221, and the other outside light is transmitted through the metallic layer 221 and the insulating layer 222. The transmitted light is reflected into second reflection light R2 at the gate line 241. At this time, as shown in the figure, if the first and second reflection lights R1 and R2 have phase difference of $\lambda/2$, destructive interference occurs, and the reflection lights are dissipated. Since a small amount of light passes through an upper surface of the antireflection layer 220, the light may be transmitted to the outside again through the organic light emitting portion or may be dissipated in the driving element portion, whereby the outer visibility of a screen is not affected.

To cause the destructive interference, the metallic layer 221 may be formed of a metallic material (e.g. one or more of titanium (Ti), molybdenum (Mo) and chromium (Cr)) and may have a thickness of about 50 Å to about 200 Å. The insulating layer 222 may be formed of an inorganic material (e.g. one or more of silicon oxide (SiOx), silicon nitride (SiNx), silicon oxynitride (SiON) and aluminum oxide (AlOx)) and may have a thickness of about 500 Å to about 3000 Å. The insulating layer 222 may have a refractive index of about 1.4 to about 1.7.

Figure 6:
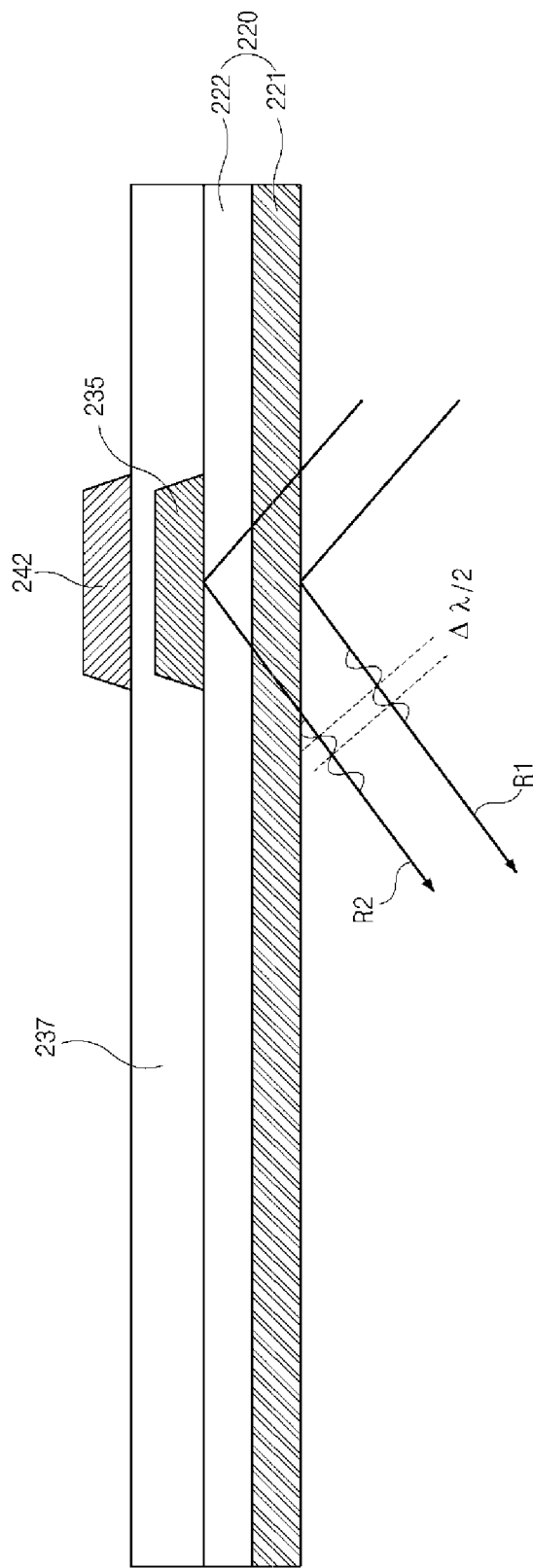
FIG. 6 is a cross-sectional view of illustrating an antireflection layer according to additional embodiments of the present invention.

FIG. 6 is a cross-sectional view of illustrating the antireflection layer according to other embodiments of the present invention.

In FIG. 5, the antireflection layer 220 of the present invention may include at least one metallic layer 221 and at least one insulating layer 222. And a gate insulating layer 237 is formed between the data line 242 and the insulating layer 222.

In FIG. 6, the data line 242 is shown as the metallic line, but the metallic line is not limited to the data line 242. The metallic line may also include the power supply line and compensation circuit and a metallic portion which are formed on the same layer as the gate insulating layer 237 or on one or more other insulating layer.

In order destructive interference to occur, a reflecting metal portion 235 may be formed on the insulating layer 222 of the antireflection layer 220. If a first reflection light R1 from a metallic layer 221 and a second reflection light R2 from the reflecting metal portion 235 are overlapped with a phase difference which is a multiple of $\lambda/2$, destructive interference may occur, and the first and second reflection light R1 and R2 may be dissipated.

Therefore, the reflecting metal portion 235 may be formed in a region corresponding to the data line 242 or possible metallic lines mentioned above. The reflecting metal portion 235 may be formed of the same material as the gate electrode simultaneously. The reflecting metal portion 235 is formed on the insulating layer 222, so outside light transmitted through the metallic layer 222 may be reflected into the second reflection light R2 from the reflecting metal portion 235. The destructive interference between the second reflection light R2 and the first reflection light R1 may be occur and the first and second reflection light R1 and R2 may be dissipated.

Figure 7:
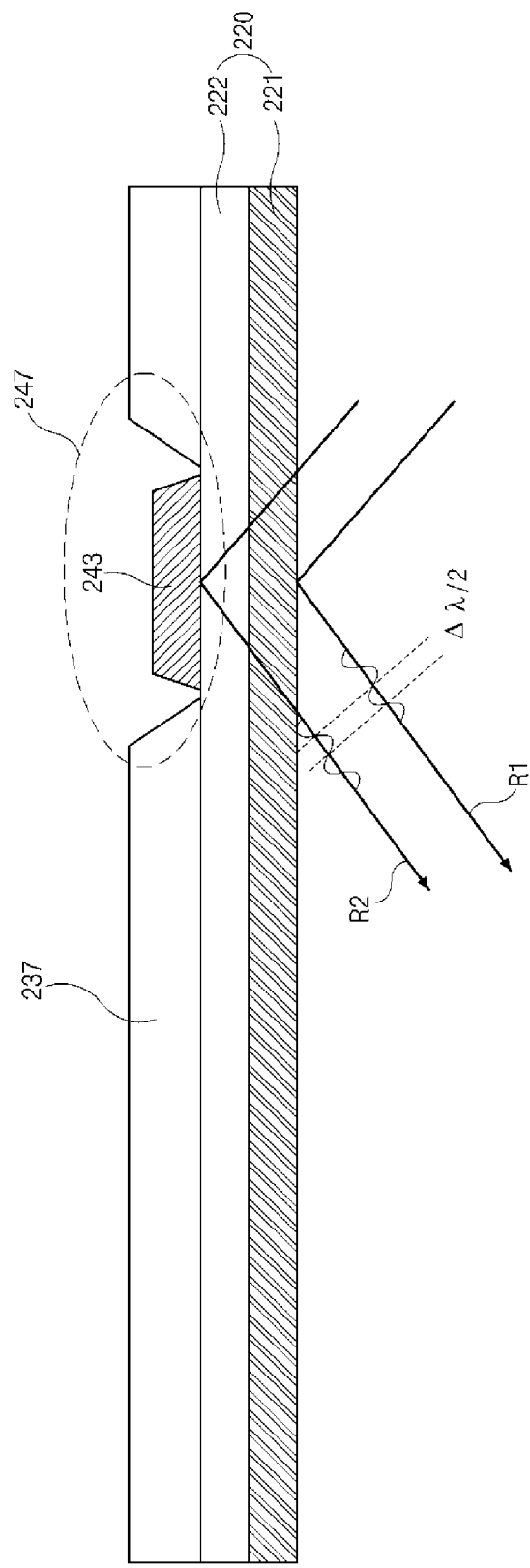
FIG. 7 is a cross-sectional view of illustrating an antireflection layer according to additional embodiments of the present invention.

FIG. 7 is a cross-sectional view of illustrating the antireflection layer according to other embodiments of the present invention.

In FIG. 7, the antireflection layer 220 is formed on the substrate 201. And the gate insulating layer 237 is formed between the metallic line and the insulating layer 222.

In FIG. 7, power supply line 243 is shown as the metallic line, but the metallic line is not limited to the power supply line 243. The metallic line may also include the power supply line and compensation circuit and a metallic portion which are formed on the same layer as the gate insulating layer 237 or on one or more other insulating layer.

The power supply line 243 may be formed on the antireflection layer 220. In order for the power supply line 243 to be in contact with the antireflection layer 220, the insulating layer 222 may be patterned to form a contact pattern 247, which exposes the antireflection layer 220. The power supply line 243 may be formed on the exposed antireflection layer 220 surrounded by the contact pattern 247. Therefore, the power supply line 243 may be directly in contact with the antireflection layer 220. And a first reflection light R1 reflected from a metallic layer and a second reflection light R2 reflected from the power supply line 243 may be dissipated by destructive interference therebetween.

Figure 8:
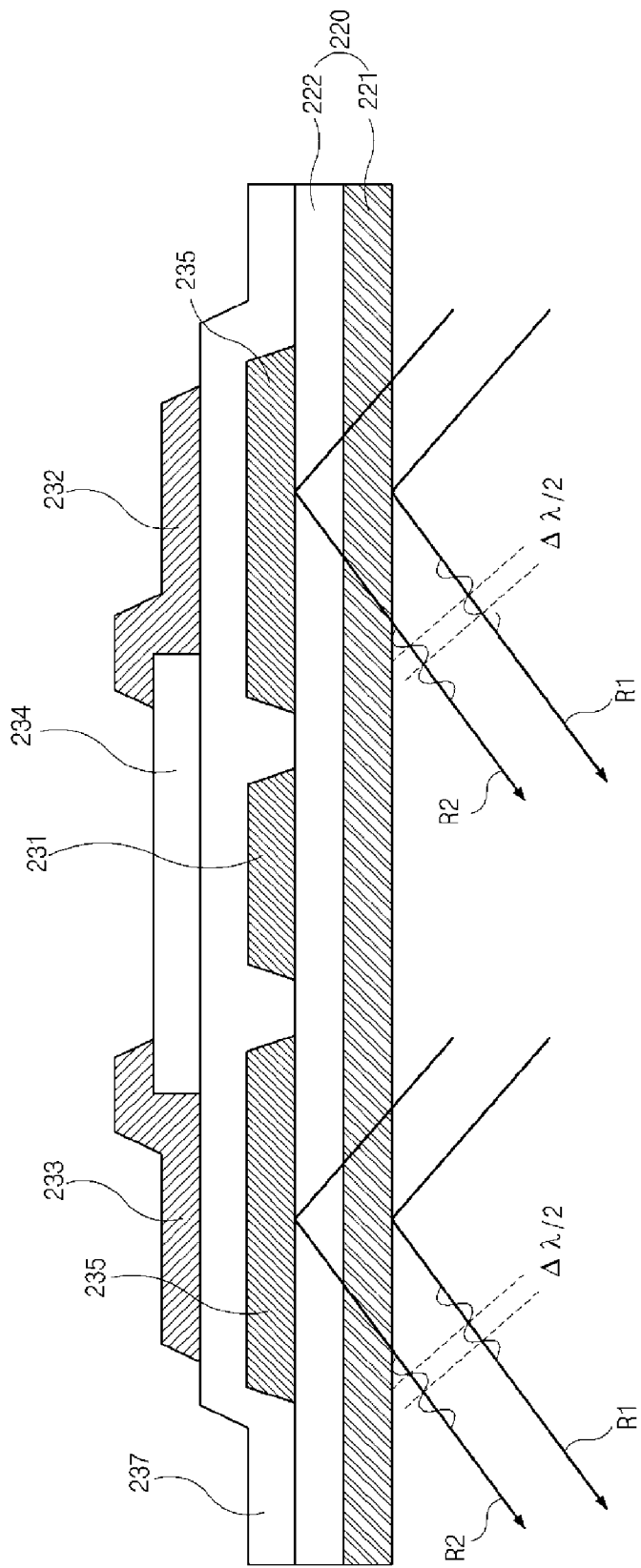
FIG. 8 is a cross-sectional view of illustrating an antireflection layer according to additional embodiments of the present invention.

FIG. 8 is a cross-sectional view of illustrating an antireflection layer 220 and a thin film transistor 230 according to other embodiments of the present invention.

In FIG. 8, reflecting metal portions 235 are formed on the same layer as the antireflection layer 220 in regions corresponding to the source electrode 232 and the drain electrode 233 which are formed on a gate insulating layer 237. A gate electrode 231 is formed between the reflecting metal portion 235 on the antireflection layer 220. Therefore, outside light transmitted to the thin film transistor 230 may be reflected from the reflecting metal portion 235. The outside light reflected from the reflecting metal portion 235 may become a second reflection light R2 and may be outputted outside. And the second reflection light R2 may be dissipated by destructive interference with a first reflection light R1 reflected from the metallic layer 221.

According to the present invention, in the organic light emitting diode display device, the expensive polarizer may be replaced by the antireflection layer having a double-layered structure of the metallic layer and the insulating layer.

In addition, since there is no polarizer preventing reflection and causing low transmittance, the transmittance of the panel may be increased, and the brightness may be improved.

Moreover, since the antireflection layer allows high transmittance of light, the power consumption may be reduced. The lifetime may be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
   a substrate;
   a antireflection layer on a first surface of the substrate, the antireflection layer comprising a metallic layer and an insulating layer;
   a driving element portion on the antireflection layer, the driving element portion comprising a thin film transistor and metallic lines, wherein the thin film transistor comprises a gate electrode, a gate insulation layer, an active layer, and source and drain electrodes;
   a reflecting metal portion on the antireflection layer under the metallic lines, the reflecting metal portion formed of the same material as the gate electrode; and
   an organic light emitting portion driven by the driving element portion, the organic light emitting portion comprising a color filter, an anode electrode, and an organic light emitting layer.

2. The organic light emitting diode display device according to claim 1, wherein the reflecting metal portion and the gate electrode are formed on the same layer.

3. The organic light emitting diode display device according to claim 1, wherein the metallic lines comprises a gate line, and the gate line is formed of the same material as the reflecting metal portion and the gate electrode.

4. The organic light emitting diode display device according to claim 1, wherein the metallic lines are formed on the antireflection layer.

5. The organic light emitting diode display device according to claim 4, wherein the metallic lines comprise a data line, and the data line is formed on the antireflection layer.

6. The organic light emitting diode display device according to claim 1, wherein the antireflection layer is absent in an area corresponding to the organic light emitting portion.

7. The organic light emitting diode display device according to claim 1, wherein the antireflection layer is formed in an area corresponding to the thin film transistor and the metallic lines of the driving element portion.

8. The organic light emitting diode display device according to claim 1, further comprising a antireflection film formed on a second surface of the substrate.

9. The organic light emitting diode display device according to claim 1, further comprising a micro lens film.

10. The organic light emitting diode display device according to claim 9, wherein the micro lens film is on a second surface of the substrate.

11. The organic light emitting diode display device according to claim 9, wherein the antireflection layer is formed in an area corresponding to the driving element portion, and the micro lens film is formed in an area corresponding to the organic light emitting portion, on the same layer of the antireflection layer.

12. A display device, comprising:
    a substrate having a plurality of pixels, each pixel including an organic light emitting element region and a driving element region, said substrate not having a polarizer attached thereto; and
    a thin film layer, on a first surface of the substrate, comprising a first insulating layer, a metallic layer and a second insulating layer, sequentially layered and configured to minimize a reflection of the light from the outside and to increase light emission brightness at the organic light emitting element region.

13. The display device according to claim 12, wherein the metallic layer is a material comprised of one among titanium (Ti), molybdenum (Mo) and chromium (Cr), and has a thickness of about 50 Å to about 200 Å.

14. The display device according to claim 12, wherein the driving element region includes a thin film transistor having a gate electrode, a gate insulation layer, an active layer, source and drain electrodes and wiring lines comprising a gate line, a data line and a power line.

15. The display device according to claim 14, further comprising a metal pattern on the thin film layer and the driving element region, configured as the same material as the gate electrode or the gate line, and to cause destructive interferences between the metal pattern and the thin film layer.

16. The display device according to claim 12, further comprising an antireflection film on a second surface of the substrate and configured to minimize the reflection of light from the substrate.

17. The display device according to claim 12, further comprising:
    a micro lens film on the organic light emitting element region and configured to further increase light emission brightness at the organic light emitting element region.

* * * * *